Feb. 14, 1967 A. M. LORD ETAL 3,304,205

THERMOELECTRIC GENERATOR

Filed March 21, 1961 3 Sheets-Sheet 1

INVENTORS
ALBERT M. LORD
STEPHEN H. FAIRWEATHER
RALPH FINELLO

BY Hill, Sherman, Meroni, Gross & Simpson ATTORNEYS.

INVENTORS
ALBERT M. LORD
STEPHEN H. FAIRWEATHER
BY RALPH FINELLO
Hill, Sherman, Meroni, Gross & Simpson
ATTORNEYS INVENTORS
ALBERT M. LORD
STEPHEN H. FAIRWEATHER
RALPH FINELLO
BY
Hill, Sherman, Meroni, Gross & Simpson ATTORNEYS United States Patent Office 3,304,205
Patented Feb. 14, 1967

3,304,205
THERMOELECTRIC GENERATOR

Albert M. Lord, Olmsted Falls, Stephen H. Fairweather, Lyndhurst, and Ralph Finello, Cleveland Heights, Ohio, assignors to TRW Inc., a corporation of Ohio
Filed Mar. 21, 1961, Ser. No. 97,228
10 Claims. (Cl. 136—208)

The present invention relates to a thermal electromotive force generator and more particularly to an improved portable unit thermoelectric generator employing improved mechanism for cooling the cold junction of the generator.

A feature of the invention is the provision of a boiler-condenser to cool a thermoelectric cold junction.

A further feature of the invention is the provision of a condenser in the form of an expandable bellows to provide a constant cooling rate.

As will be appreciated from the disclosure the features of the invention have utility in various environments but are particularly well suited for a portable electrical power generating unit and the features will be disclosed in connection with this mechanism. The invention contemplates providing a lightweight portable electric power generator for use in the field in various environments and over wide temperature ranges. The electrical generator utilizes a thermoelectric device for generating electrical power from thermal energy wherein an electrical circuit containing two junctions of different electrically conductive materials maintained at different temperatures gives rise to an electromotive force. The device has a hot junction and a cold junction with the hot junction conveniently heated by a fuel consuming burner and the cold junction cooled by a boiler containing fluid in heat transfer relationship with the cold junction with the boiler connected to a heat dissipating condenser.

An object of the invention is to provide improved mechanism for heating and cooling the hot and cold junctions of a thermoelectric generator which are suited for embodiment in a portable generating unit so as to obtain a practical lightweight reliable electrical generator for field use.

A further object of the invention is to provide a thermoelectric generator wherein the cold junction is maintained at a lower temperature than the hot junction by removing heat energy therefrom and dissipating the heat energy into the ambient air, and which is capable of practical use between wide variations in ambient air temperature.

A further object of the invention is to provide a portable thermoelectric generator capable of automatically maintaining a substantially constant electrical output with varying changes in the environment.

A still further object of the invention is to provide an improved mechanism for holding electrodes in contact with a thermoelectric generating member.

Other objects and advantages will become more apparent with the teaching of the principles of the invention in connection with the disclosed embodiments thereof in the specification, claims and drawings, in which:

Figure 2:
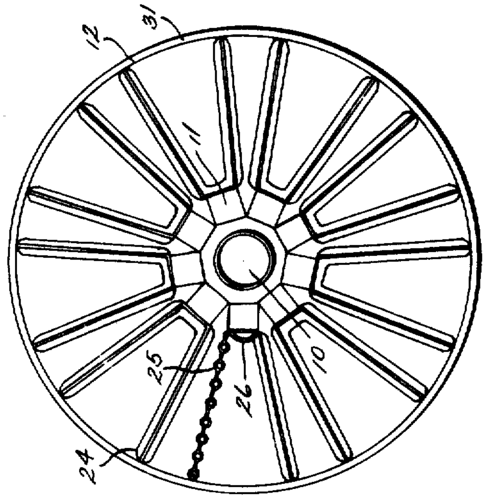
FIGURE 2 is a top plan view of the generator of FIGURE 1, shown with parts broken away.
Figure 1:
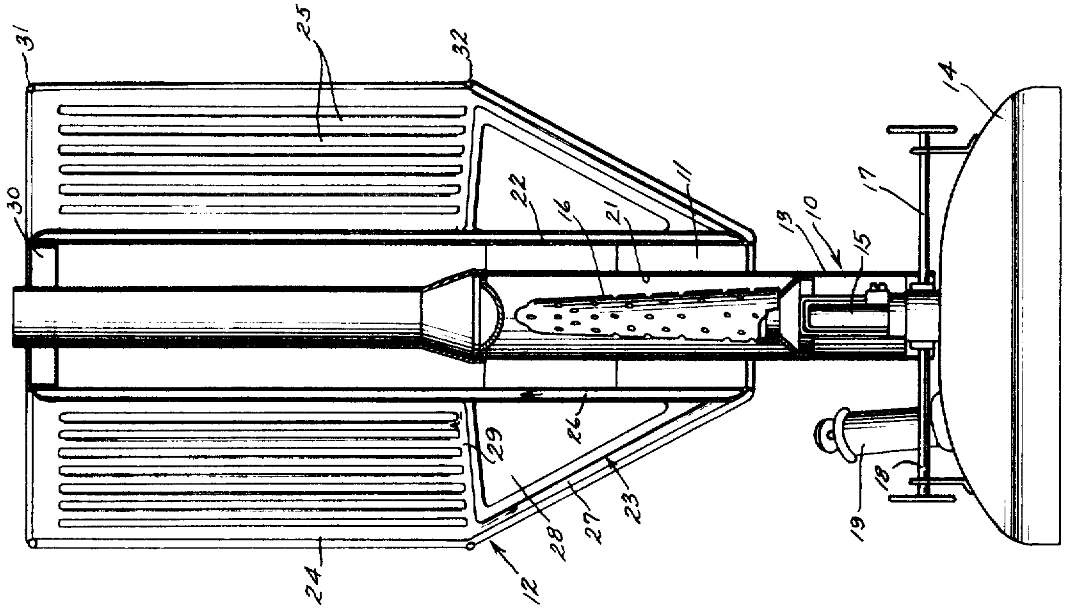
FIGURE 1 is a side elevational view shown partially in section of an electrical generator constructed in accordance with the principles of the present invention.

As illustrated in FIGURES 1 and 2, a portable unit electric generator includes a burner assembly 10 which provides a convenient stand for the unit. Suitably supported around the burner unit so that their hot junctions are maintained at an elevated temperature by the burner, are thermocouple members 11. Arranged outwardly of the thermocouple members 11 to maintain a cold junction of the thermocouple members at a reduced temperature is a boiler condenser 12.

The burner assembly 10 includes a hollow vertical tubular shell 13 supported at its lower end on a fuel tank 14 provided conveniently with a flat base so as to support the generator unit in an upright position. Adjustable supports may be connected to the tank or other parts of the generator for mounting or otherwise supporting the unit such as on uneven terrain.

Mounted within the tube 13 is a burner 15 which is supplied with fuel from the tank 14. Fuel such as gasoline is used or diesel fuel or other fuels may be employed by using the appropriate burner. The flow of fuel from the tank is controlled by a fuel control 17 operated by a manually rotatable stem and an air control 18 also operated by a manually rotatable stem. The tank 14 may be pressurized by an air pump 19 and fuel filled into the tank 14 through a suitable opening closed by a cap and for this purpose the pump 19 may be removable.

Mounted above the burner 15 within the tube 13 is a perforated heat radiating mantle 16 for aiding and directing heat outwardly against the inner surfaces 21 of the thermoelectric cells or members 11.

The thermoelectric cells are positioned in contact with the outer surface of the tube 13 so that their inner surface 21 transmits heat directly to the hot junction of the thermocouple. Their outer surface 22 is in heat transfer relationship with the cold junction of the thermocouple. Each of the cells is conveniently placed in a hermetically sealed container and is suitably supported outwardly of the tube 13. The cells are removably supported by suitable mechanism, not shown, for replacement and for cleaning and servicing of the unit, and other elements such as the burner are also mounted for cleaning and servicing by suitable mechanism, which need not be shown in detail.

For maintaining the cold junctions of the thermoelectric cells 11 at a temperature below the hot junctions, the boiler condenser 12 includes a container or conduit for a circulating cooling fluid and the boiler or conduit 23 is in communication with passages 25 through radiating fins or radiators 24 which serve as condensers for condensing and cooling the fluid. When various fluids may be used, ethylene glycol has been found to be advantageous.

The boiler or container 23 is shown as being triangularly shaped to provide an inner conduit 26 which is in direct heat transfer relationship with the outer surface 22 having the cold junctions of the thermoelectric cells 11. An outer leg 27 of the conduit communicates at its lower end with the conduit 26 and its upper end with a header 29 which is in communication with the passages 25 through the radiating fins 24. The conduits 26 and 27 have a triangular shaped air space 28 between them for the passage of air and are arranged so that circulation of the coolant fluid will be encouraged with the fluid flowing upwardly in the conduit 26 and vaporizing, then into the condenser passages 25 to be cooled and condense in the radiating fins 24, and then downwardly in the outer conduit 27, as indicated by the arrows.

The radiating fins 24 are formed of a suitable material and construction for condensing the coolant and dissipating heat energy. A structure found to be advantageous is obtained by providing fins formed by a process wherein opposed sheets of lightweight sheet material such as aluminum are bonded together to form flow passages therebetween. Two adjacent fins may be constructed as a unit by bending them into a U-shape with the legs of the U extending radially. The inner ends of the fins are suitably joined such as by being connected at their upper inner ends to a support ring 30 and at their outer ends to support rings 31 and 32.

The mechanism is well adapted for operation over a wide range of temperatures which will of course vary the rate at which heat energy is dissipated from the fins to the ambient atmosphere. The mechanism is preferably constructed with a fin radiation area and a burner size that will be capable of operation within ranges of from −65° F., in a 50 m.p.m. wind, to an air temperature of 125° F. with no wind. From the high temperature to the low temperature the temperature of the cold junction of the thermoelectric cells 11 may drop by 400° and the power output would then rise 30 to 40%. For a uniform electrical power output this change is compensated for by modulating the heat input to the hot junction, such as in the manner illustrated in FIGURE 5.

Figure 5:
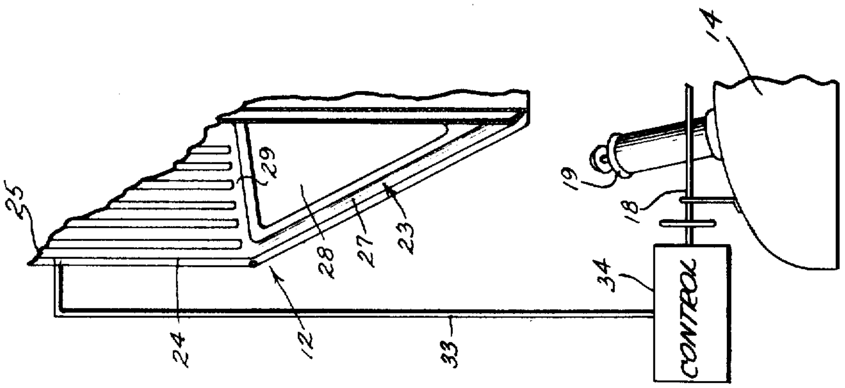
FIGURE 5 is a fragmentary elevational view with parts removed of an arrangement for controlling the output of the generator of FIGURE 1.

The temperature of the heat dissipating fins 24 can be inferred from the pressure of the condensing vapor within the fin passages 25. By measuring this pressure and controlling the heat input of the burner accordingly, a constant electrical output of the thermoelectric cells 11 can be obtained. It is of course contemplated that control of the burner may be obtained by measuring the temperature of the condensing fluid directly. By measuring pressure of the condensing fluid however, a simplified mechanism may be employed in the form of a Bourdon tube, shown schematically at 33. As described in McGraw-Hill Encyclopedia of Science and Technology, volume 2, page 311, a Bourdon-spring pressure gage is "A mechanical pressure-measuring instrument employing as its sensing element a curved or twisted metallic tube, flattened in cross section. One end of the tube is closed, and the fluid pressure to be measured is applied through the other end. As the pressure is increased, the tube becomes more nearly circular in cross section, and tends to straighten. The motion of the free (closed) end of the tube is a measure of the internal pressure." The tube 33 connected to one of the fin passages 25 and its lower moving end is connected to the air control 18 for reducing the heat input when the cold junction temperature drops. The control 34 is not shown in detail, and it will be appreciated by those skilled in the art that various mechanical movement transfer mechanisms may be employed such as a lever arrangement or a pinion on the stem 18 driven by a segment gear attached to the Bourdon tube 33, and these are well known and need not be shown in detail. This control of heat input as a function of the temperature and pressure of the coolant, which changes as a function of cold junction temperature, tends to maintain a reasonably constant output voltage in power. Further regulation can be obtained by electrical control mechanisms such as a Zener diode. This control insures that the thermoelements will operate under peak temperature conditions and will insure maximum life and reliability for the thermoelectric elements. This arrangement is utilized with fixed fins 24, as shown in FIGURES 1, 2 and 5, and no altitude compensation is required.

As an example of the foregoing principles, a thermoelectric generator capable of providing a minimum of 30 watts of power has a flux rate at the cold junction surface of 14,000 B.t.u./ft.$^2$ at a design temperature of 400° F. for the cold junction. Ordinary solid metal fins would be prohibitively heavy for a portable unit and heat dissipation fins formed of aluminum with .040 inch double wall thickness to form a network of circulating passages provide a total weight of fins, coolant fluid and attachments of 1.8 pounds. The entire unit can be constructed with a total weight of 7 pounds, well suited for transportation and field use and the unit is of rigid construction resistant to damage from impact and dropping.

The hermetically sealed thermoelectric elements may be held by various arrangements but preferably are brazed to the tube 13 and can be individually replaced.

Figure 4:
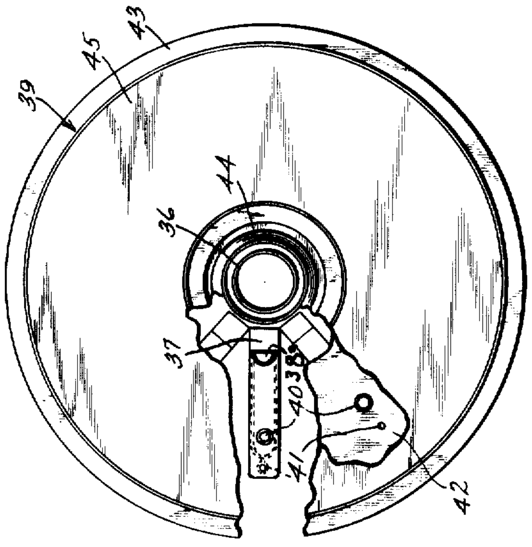
FIGURE 4 is a top plan view of the generator of FIGURE 3 with parts broken away.
Figure 3:
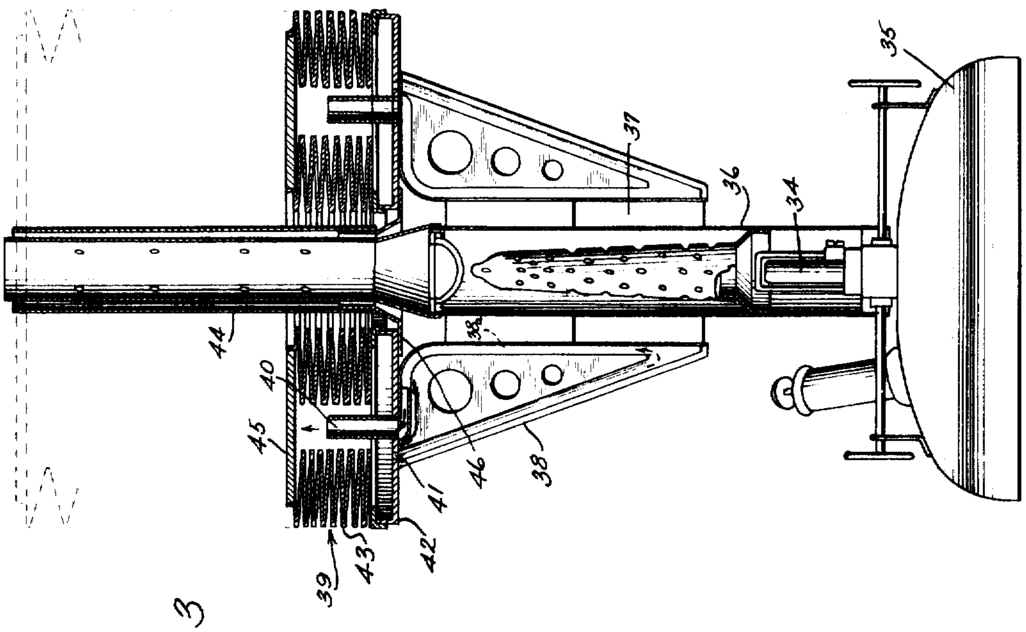
FIGURE 3 is a side elevational view, shown partially in section, of an electrical generator constructed in accordance with the principles of the invention and embodying modifications.

FIGURES 3 and 4 illustrate a thermoelectric generator having a condenser radiator with variable fins which dissipate heat energy at variable rates.

The burner assembly and thermoelectric cells are of substantially the same construction as the arrangement of FIGURES 1, 2 and 5, with a burner 34, and a fuel tank 35 being provided. Mounted on the tank is a burner tube 36 surrounded by thermoelectric cells 37. Mounted outwardly of the cells is a boiler 38 providing inner conduits for the circulation of coolant fluid and the boiler being in heat transfer relation with the cold junctions of the thermoelectric cells 37.

Mounted above the boiler is the radiator condenser 39. The conduits of the boiler 38 communicate with the interior of the condenser and vaporized fluid flows up through passages **38*a*, enters the condenser through a short hollow vertical tube 40, as shown by the arrows, and returns through an opening 41 in a lower wall 42 of the condenser to descend and flow into the base of the passages 38*a*. The condenser includes a bellows 43 connected at its lower end to the wall 42 and at its upper end to an annular wall 45. The bellows is supported with the lower wall 42 mounted on a lower flanged end 46 of a tube 44 which surrounds the burner tube 36 and provides a radiation shield preventing direct radiation from the upper end of the burner tube 36 to the bellows 43**.

The bellows 43 has a negligible spring constant and is evacuated before assembly and held rigidly closed by atmospheric air pressure when the power supply unit is not operated. When operation of the mechanism begins by starting the burner, the boiling fluid in the boiler 38 inflates the bellows until it has sufficient area available and has sufficient capabilities of dispersing heat to the atmosphere to condense the vapor at the same rate as it is formed.

It is of course recognized that the bellows will expand or contract as a function of atmospheric pressure and the mechanism is designed so that the permissible variations in supply voltage are not exceeded by barometric changes. At higher altitudes the saturation temperature of the coolant fluid will be lowered and thus the voltage output of the unit will be increased. This may be compensated for by modulating the heat input or by adjusting the output voltage by means of a Zener diode.

The variable radiation condenser automatically compensates for variation in wind and ambient temperature by inflating or expanding until the area is adequate to condense the vapor and thus proper operation is maintained.

Thus it will be seen that we have provided an improved power generator which meets the objectives and advantages above set forth. Both the fixed fin arrangement of FIGURES 1, 2 and 5, and the variable fin arrangement of FIGURES 3 and 4 make it possible to reduce the cooling system weight, and the concept makes possible the arrangement wherein the rate of cooling can be varied.

The embodiment provides a unique apparatus for cooling thermoelectric cold junctions by a boiler condenser. The mechanism also provides a unique manner for varying heat dissipation for controlling condensing rate, as illustrated by the bellows of FIGURES 3 and 4.

Figure 6:
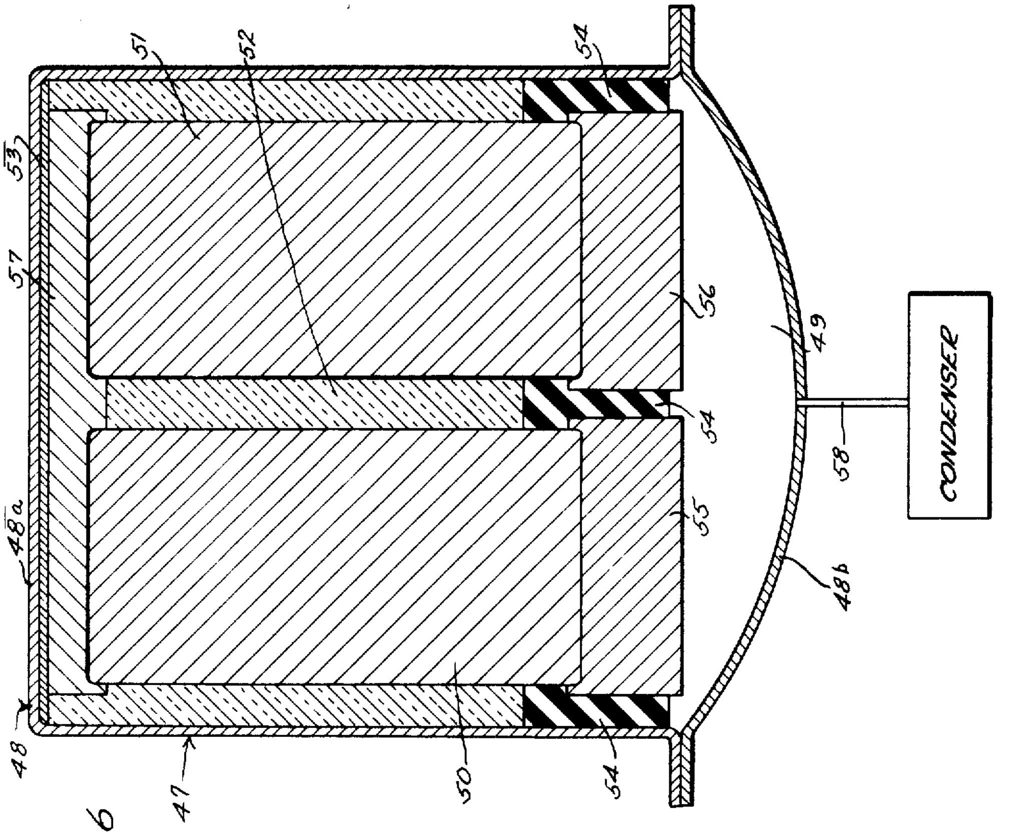
FIGURE 6 is an enlarged sectional view taken through a thermocouple member showing details of construction for holding the electrodes in electrical contact.

It is necessary to provide a mechanism for maintaining the contact between the hot and cold junctions of the thermoelectric cells 11 and 37. FIGURE 6 illustrates the arrangement of the instant invention wherein the force of fluid pressure obtained from the condenser is used for this function, thereby eliminating the weight and expense of spring or screw loaded clamps.

As illustrated in FIGURE 6, a thermoelectric cell 47 is enclosed in a metal casing 48 providing a pressurized chamber 49 at one end. Within the casing are mounted a pair of thermccouple elements 50 and 51, separated by a layer of thermal insulation 52. Connected across one end of the thermocouple elements 50 and 51 is a hot junction electrode 57 connected to the casing by a high temperature cement 53. At the other end of the thermocouple elements 50 and 51 are cold junction electrodes 55 and 56 shown as separated from the casing and from each other by blocks of silicone rubber 54. Suitable electrical leads, not shown, are connected to the cold junction electrodes 55 and 56.

For pressing the cold junction electrodes 55 and 56 tightly against the ends of the thermocouple elements 50 and 51 and thereby pressing the elements tightly against the hot junction electrode 57 to maintain a good electrical contact for the hot and cold junctions, the chamber 49 in the casing is connected to the boiler condenser. As shown schematically a line 58 connects the chamber 49 to the condenser, and it will be understood that various suitable connecting arrangements may be used. This utilizes the pressurized coolant which is available for maintaining a constant electrical contact pressure.

The thermocoup e cell 47 will be positioned between a heat source and a coolant source such as by being located in the mechanisms shown in FIGURES 1 through 5. The cell 47 will then be positioned so that its end wall **48*a* will be against the center tube of the burner (13 or 36) and its end wall 48*b* is suitably supported. The chamber 49 is the coolant boiler and will be suitably connected to the condenser. Cold junction electrodes 55 and 56** are cooled by direct heat transfer to the boiling fluid.

The drawings and specification present a detailed disclosure of the preferred embodiments of the invention, and it is to be understood that the invention is not limited to the specific forms disclosed, but covers all modifications, changes and alternative constructions and methods failing within the scope of the principles taught by the invention.

We claim as our invention:

1. A portable unit electrical generator comprising a burner, a fuel supply for the burner having fuel flow controls, a boiler for heat transfer fluid, a condenser connected to the boiler to condense and cool the fluid and return it to the boiler, heat radiation fins connected to the condenser for dissipating heat to the ambient surroundings, and means for supporting a thermoelectric generating unit having a hot junction surface in heat transfer relationship with said burner and having a cold junction surface in heat transfer relationship with said boiler.

2. In an electrical power generating mechanism having a thermoelectric generator with a hot junction and a cold junction, the combination comprising a heater for heating said hot junction, means for controlling said heater for controlling the temperature of the hot junction, a cooler for cooling the cold junction, means for controlling the cooler for controlling the temperature of the cold junction, and means interconnecting said heater controlling means and said cooler controlling means for simultaneously changing the heating and cooling capacities of said heater and cooler so that the temperature differential between said hot and cold junctions will remain substantially uniform for a constant electrical output.

3. In an electrical power generating mechanism having a thermoelectric generator with a hot junction and a cold junction, the combination comprising a heater for heating said hot junction, means for controlling said heater for varying the temperature of the hot junction, a boiler condenser for carrying away heat from said cold junction, means connected to said condenser sensing the pressure of liquid condensing therein and connected to said heater controlling means for varying the temperature of the hot junction as a function of pressure in the condenser and maintaining a constant temperature differential between the hot and cold junctions for a uniform output of electrical energy.

4. A mechanism in accordance with claim 3 wherein said heater includes a burner with an air and fuel supply and said pressure sensing means includes a Bourdon tube communicating with the condenser and connected for varying at least one of said air end fuel supplies.

5. A thermoelectric generator comprising in combination a hot junction electrode having an inner and an outer surface, a cold junction electrode having an inner and an outer surface, a thermocouple member having hot an cold surfaces engaged respectively by the inner surfaces of said hot and cold electrodes, means for heating the hot surface of the thermocouple member, means for cooling the cold surface of the thermocouple member, and means for holding said electrodes in conducting engagement with said member including a fluid chamber exposed to the outer surface of one of said electrodes with the pressure of the fluid urging said one electrode against the thermocouple member.

6. In a thermoelectric power generator comprising a hot junction electrode having an inner end and outer surface, a cold junction electrode having an inner and an outer surface, a thermocouple member having a hot surface and a cold surface with said surfaces respectively engaged by the inner surfaces of the hot and cold electrodes, means for heating the hot surface of the thermocouple member, a boiler condenser for cooling the cold surface of the thermocouple member with the boiler in heat transfer relationship with said cold surface, and means defining a fluid chamber connected to said boiler condenser exposed to the outer surface of one of said electrodes with the pressure of the fluid in the chamber urging said one electrode against the thermocouple member holding it in electrical contact therewith.

7. In a portable unit electrical generator comprising a burner, a fuel supply for the burner having fuel flow controls, a bolier for a heat transfer fluid, a condenser connected to the boiler to condense and cool the fluid and return it to the boiler, a plurality of radially extending vertical separated heat radiation fins connected to the condenser for dissipating heat to the ambient surroundings, and means for supporting a thermoelectric generating unit having a hot junction surface in heat transfer relationship with said burner and having a cold junction surface in heat transfer relationship with said boiler.

8. A thermoelectric cell comprising a sealed casing, a thermoelectric member in the casing having a hot junction end and a cold junction end, hot and cold electrodes in contact with the ends of said member, and a fluid pressure chamber in the casing with at least one of said electrodes exposed to the chamber and held in engagement with said member by the pressure of fluid in the chamber.

9. In an electrical power generating mechanism having a thermoelectric generator with a hot junction and a cold junction, the combination comprising means for heating the hot junction, and a liquid circulating heat radiator having a plurality of smaller chambers in communication with a main chamber for receiving vaporized liquid with each smaller chamber having heat radiating surfaces for transferring heat energy to the surrounding air, and having a liquid passage communicating with the main chamber in heat transfer relationship with the cold junction for maintaining it at a temperature level lower than said hot junction.

10. An electrical power generating mechanism comprising a plurality of thermoelectric generating units each with a hot junction and a cold junction, said units arranged annularly with the hot junction facing radially inwardly, heating means at the center of said units, and a liquid circulating heat radiator radially outwardly of said units having a first passage in heat transfer relationship with said cold junctions with the liquid rising therein and vaporizing, having a second passage communicating with the base of the first passage for condensed liquid to descend and flow into the first passage, and having a heat radiating chamber for discharging heat energy to the ambient air.

References Cited by the Examiner

UNITED STATES PATENTS

| | | | |
|---|---|---|---|
| 615,541 | 12/1898 | Emanuel | 136—4.1 |
| 911,446 | 2/1909 | Rittershaussen | 136—4.12 |
| 1,286,429 | 12/1918 | Shindel | 136—4 |
| 2,456,070 | 12/1948 | Molek et al. | 36—4.1 |
| 2,463,944 | 3/1949 | Borden | 136—4.1 |
| 2,952,724 | 9/1960 | Fritts | 136—4.2 |
| 3,017,444 | 1/1962 | Fritts | 136—4.2 |

WINSTON A. DOUGLAS, *Primary Examiner.*

JOHN R. SPECK, JOHN H. MACK, *Examiners.*

J. BARNEY, ALLEN B. CURTIS, *Assistant Examiners.*